United States Patent
Cheng

(10) Patent No.: US 7,491,604 B2
(45) Date of Patent: Feb. 17, 2009

(54) TRENCH MEMORY WITH MONOLITHIC CONDUCTING MATERIAL AND METHODS FOR FORMING SAME

(75) Inventor: Kangguo Cheng, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 157 days.

(21) Appl. No.: 11/308,103

(22) Filed: Mar. 7, 2006

(65) Prior Publication Data

US 2007/0212830 A1  Sep. 13, 2007

(51) Int. Cl.
*H01L 21/8242* (2006.01)

(52) U.S. Cl. ............... 438/248; 438/391; 257/E21.647; 257/E21.65

(58) Field of Classification Search .......... 438/248, 438/391; 257/E21.647, E21.65
See application file for complete search history.

(56) References Cited

U.S. PATENT DOCUMENTS

| | | | | |
|---|---|---|---|---|
| 5,770,484 A | * | 6/1998 | Kleinhenz | .......... 438/155 |
| 6,310,375 B1 | * | 10/2001 | Schrems | .......... 257/301 |
| 6,326,658 B1 | | 12/2001 | Tsunashima et al. | |
| 6,670,235 B1 | | 12/2003 | Tews et al. | |
| 6,734,077 B2 | * | 5/2004 | Forster et al. | .......... 438/386 |
| 2004/0031992 A1 | | 2/2004 | Davis et al. | |
| 2005/0006686 A1 | * | 1/2005 | Saida et al. | .......... 257/301 |

* cited by examiner

*Primary Examiner*—Lex Malsawma
(74) *Attorney, Agent, or Firm*—Joseph P. Abate; Hoffman Warnick LLC

(57) ABSTRACT

A trench memory filled with a monolithic conducting material and methods for forming the same are disclosed. The trench memory includes a trench that has only a single, monolithic conducting material within the trench. The method includes forming a trench with a collar in the trench; forming a node dielectric on a sidewall of the trench; and filling the trench with a monolithic conducting material, such as polysilicon.

15 Claims, 15 Drawing Sheets

TRENCH MEMORY WITH MONOLITHIC CONDUCTING MATERIAL AND METHODS FOR FORMING SAME

BACKGROUND OF THE INVENTION

1. Field of the Invention

The present invention relates generally to manufacturing of a semiconductor device. More specifically, the present invention provides a method and apparatus for forming a trench memory, such as dynamic random access memory (DRAM), with a monolithic conducting material.

2. Background Art

A trench memory, for example a dynamic random access memory (DRAM), is depicted, in cross-sectional view, in FIG. 1. As is typical the trench memory (e.g., DRAM) 1 has one capacitor 2 and one transistor 4 and further includes various constructs located within, or upon, a semiconductor substrate 6. Trench memory 1 includes capacitor 2, typically located within a trench 8, that is connected to a transistor (e.g., conventional MOSFET) 4 via a buried strap 10. Transistor 4 includes a gate conductor 12, gate dielectric 14, and a drain 16 and a source 18 on either side of gate conductor 12.

Lining a portion of trench 8 is a node dielectric 20. Above node dielectric 20, also lining a portion of trench 8 is an insulating collar 22 (or collar oxide). Also within trench 8 is conducting materials 24A, 24B, and 24C which conventionally are doped polysilicon (hereinafter "poly"). Located upon insulating collar 22 is a shallow trench isolation (STI) 26.

Due to the steps of constructing trench memory 1 and its various parts, trench 8 is filled by three (3) polysilicon materials (i.e., first poly 24A, second poly 24B, and third poly 24C). Because three poly materials 24A, 24B, 24C are placed within trench 8 at temporally distinct times, poly materials 24A, 24B, 24C are not monolithic. That is conducting materials 24A, 24B, 24C are not one, integrated piece of conducting material 24 in trench 8. First poly 24A is placed first. Second poly 24B is placed later, after placement of first poly 24A and intermittent steps. Third poly 24C is placed later, after placement of second poly 24B and other intermittent steps, as well.

Interfaces are created where each poly 24 abuts another adjoining poly 24. For example, a poly 24 to poly 24 interface is created where first poly 24A meets second poly 24B. Similarly, a second poly 24 to poly 24 interface is created where second poly 24B and third poly 24C meet. A shortcoming of this trench memory 1, and the method of making it, is that each interface increases the overall resistance of trench 8, thereby causing a concomitant reduction in the overall performance of trench memory 1. Further, there are several steps in placing first poly 24A, second poly 24B, and third poly 24C, thereby increasing process time and cost.

In view of the foregoing, there exists a need for an improved process for constructing trench memory that overcomes the aforementioned deficiencies.

SUMMARY OF THE INVENTION

A trench memory filled with a monolithic conducting material and methods for forming the same are disclosed. The trench memory includes a trench that has only a single, monolithic conducting material within the trench. The method includes forming a trench with a collar in the trench; forming a node dielectric on a sidewall of the trench; and filling the trench with a monolithic conducting material, such as polysilicon.

A first aspect of the present invention provides a method of forming a trench memory, comprising the steps of: forming a trench with a collar in the trench; forming a node dielectric on a sidewall of the trench; and filling the trench with a monolithic conducting material.

A second aspect of the present invention provides a trench memory comprising: a capacitor in a trench; a collar disposed above the capacitor; and an access transistor connected to the capacitor through a buried strap, wherein the trench is filled with a monolithic conducting material.

A third aspect of the present invention provides a method of forming a trench memory comprising: forming a collar in an upper portion of a trench; forming a capacitor in a lower portion of the trench below the collar; and connecting a transistor to the capacitor, through a buried strap, wherein the trench is filled with a monolithic conducting material The illustrative aspects of the present invention are designed to solve the problems herein described and other problems not discussed, which are discoverable by a skilled artisan.

BRIEF DESCRIPTION OF THE DRAWINGS

These and other features of this invention will be more readily understood from the following detailed description of the various aspects of the invention taken in conjunction with the accompanying drawings in which.

Figure 1:
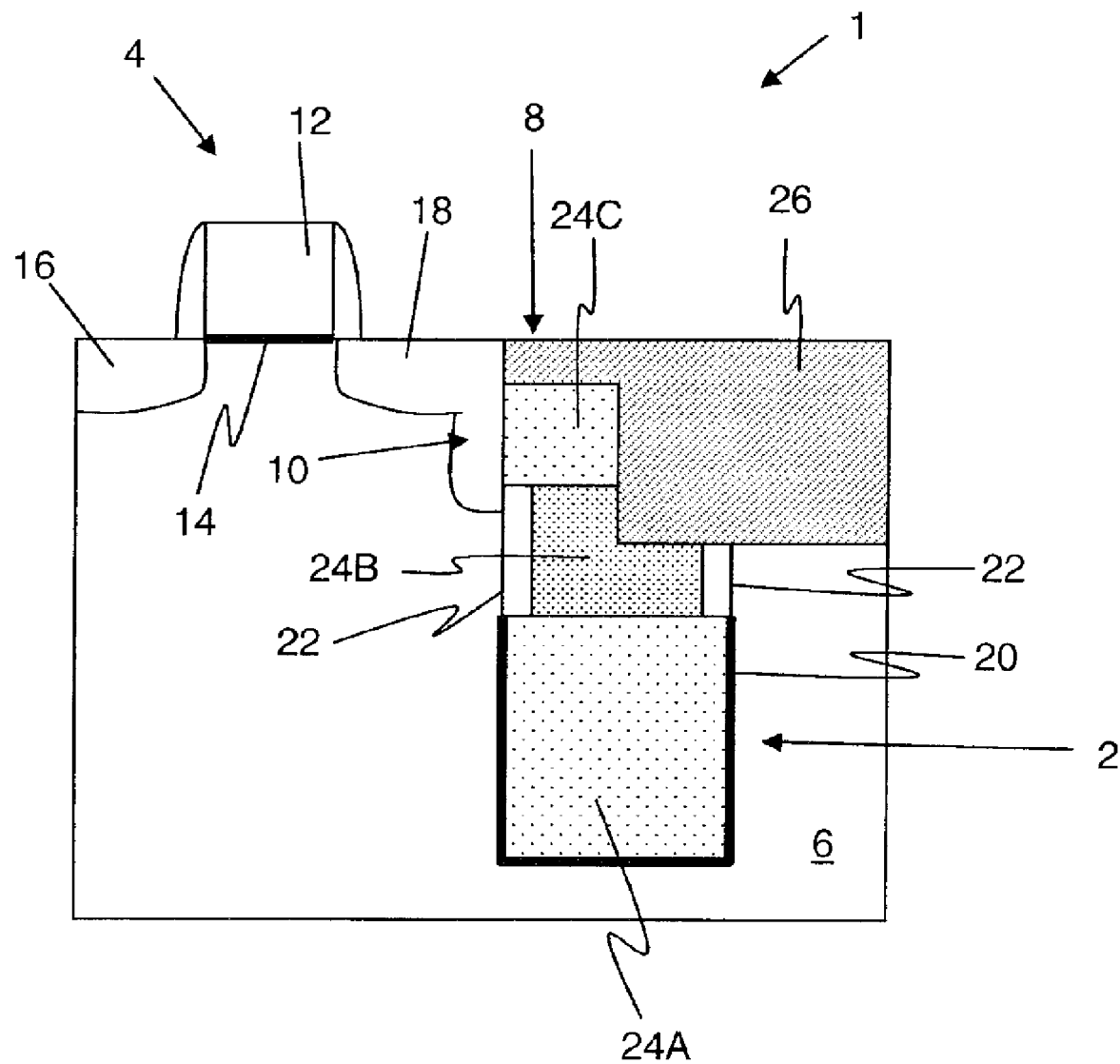
FIG. 1 depicts a cross-sectional elevation view of a multiple poly fill trench memory in the related art.

The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION

As indicated above, the present invention provides a trench memory with monolithic conducting material and methods of forming the trench memory with monolithic conducting material.

FIGS. 2A through 2E depict cross-section elevation views of a trench memory 30 undergoing the various steps of constructing a trench memory with monolithic conducting material in accordance with a first embodiment of the present invention. FIG. 3 depicts the finished first embodiment (i.e., completed trench memory 30).

Similarly, FIGS. 4A through 4G depict cross-section elevation views of various steps of forming of trench memory 130 with a monolithic conductive material in accordance with a second embodiment of the present invention. FIG. 5 depicts a finished second embodiment (i.e., completed trench memory 130).

Returning to FIGS. 2A-2E, FIG. 2A shows the starting of a process to form trench memory 30 in a first embodiment of the present invention wherein trench memory 30 has a pad layer 32 (e.g., silicon nitride) above a semiconductor (e.g., silicon) substrate 34. Between pad layer 32 and semiconductor substrate 34 may be an underlying silicon dioxide ($SiO_2$) layer (not shown). Formed into semiconductor substrate 34 is a trench 36. Further formed in the upper portion of trench 36 is an insulating collar 38 typically made of silicon dioxide ($SiO_2$), silicon nitride ($Si_3N_4$), or any suitable dielectric material. Methods for forming an insulating collar 38 in upper trench 36 are well known in the art and therefore are not described in detail in order to avoid obscuring the invention.

Figure 2A:
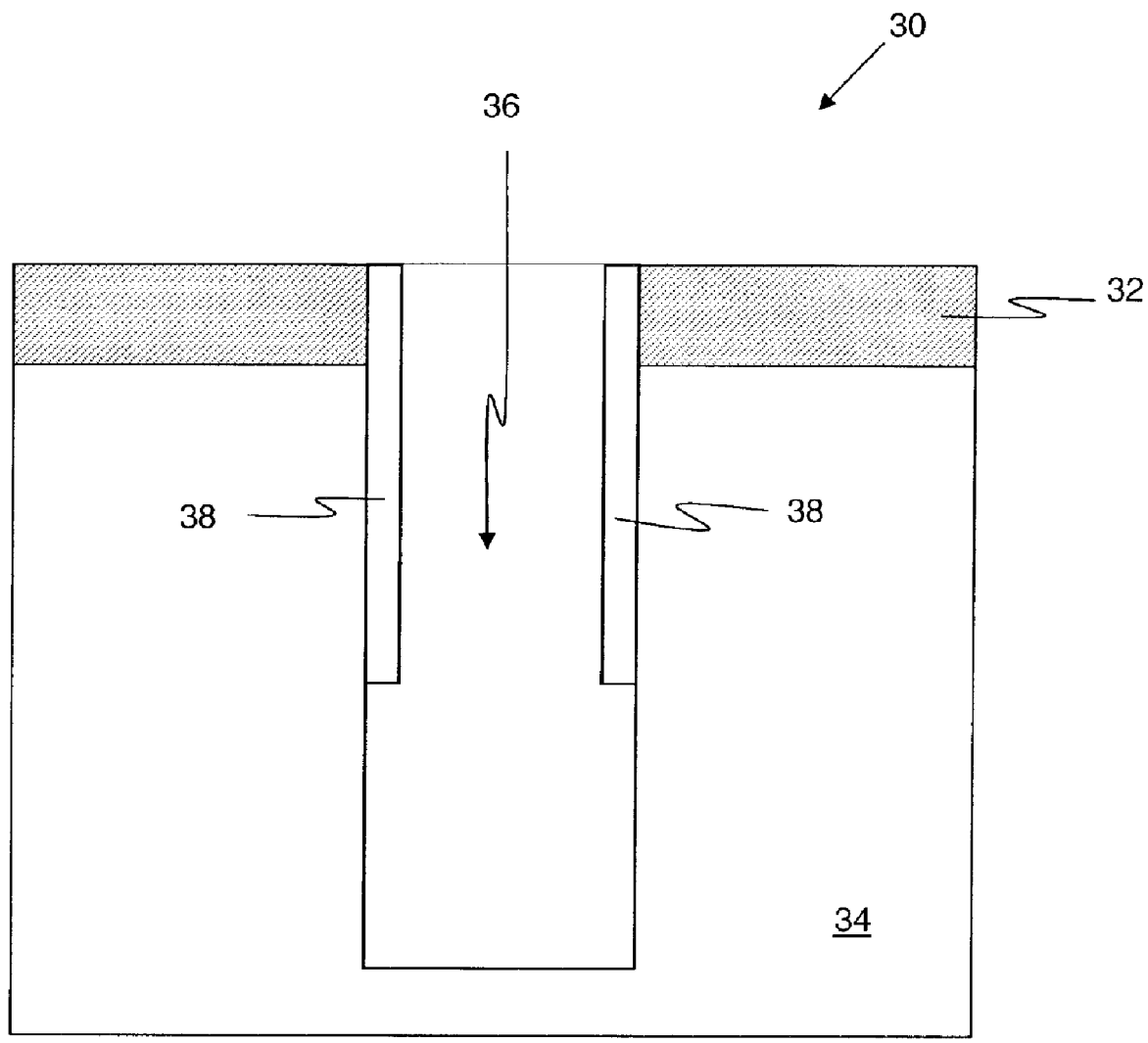
FIGS. 2A-2E depict cross-section elevation views of steps of forming a trench memory with monolithic conducting material, in accordance with a first embodiment of the present invention.
Figure 2B:
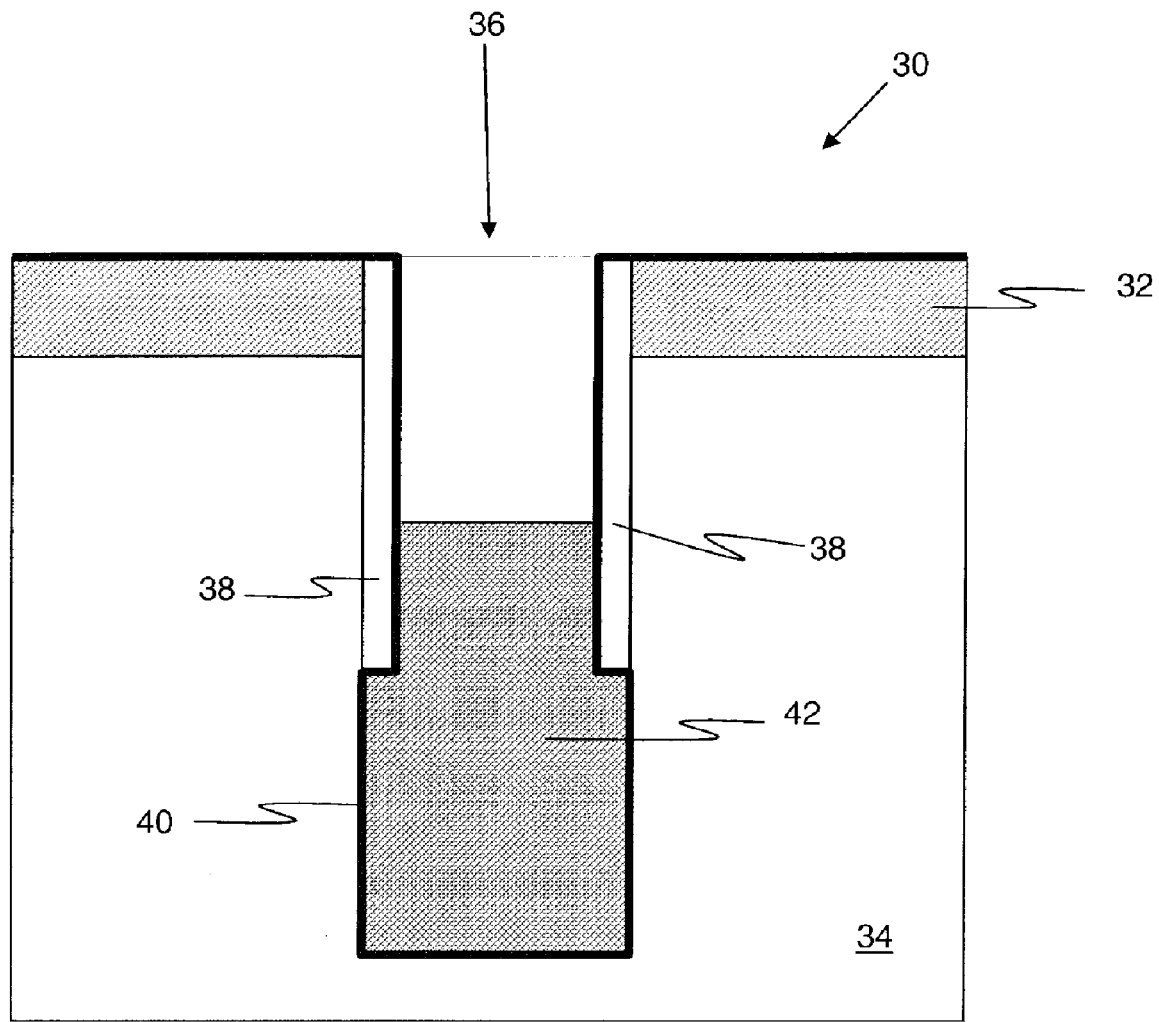
Figure 3:
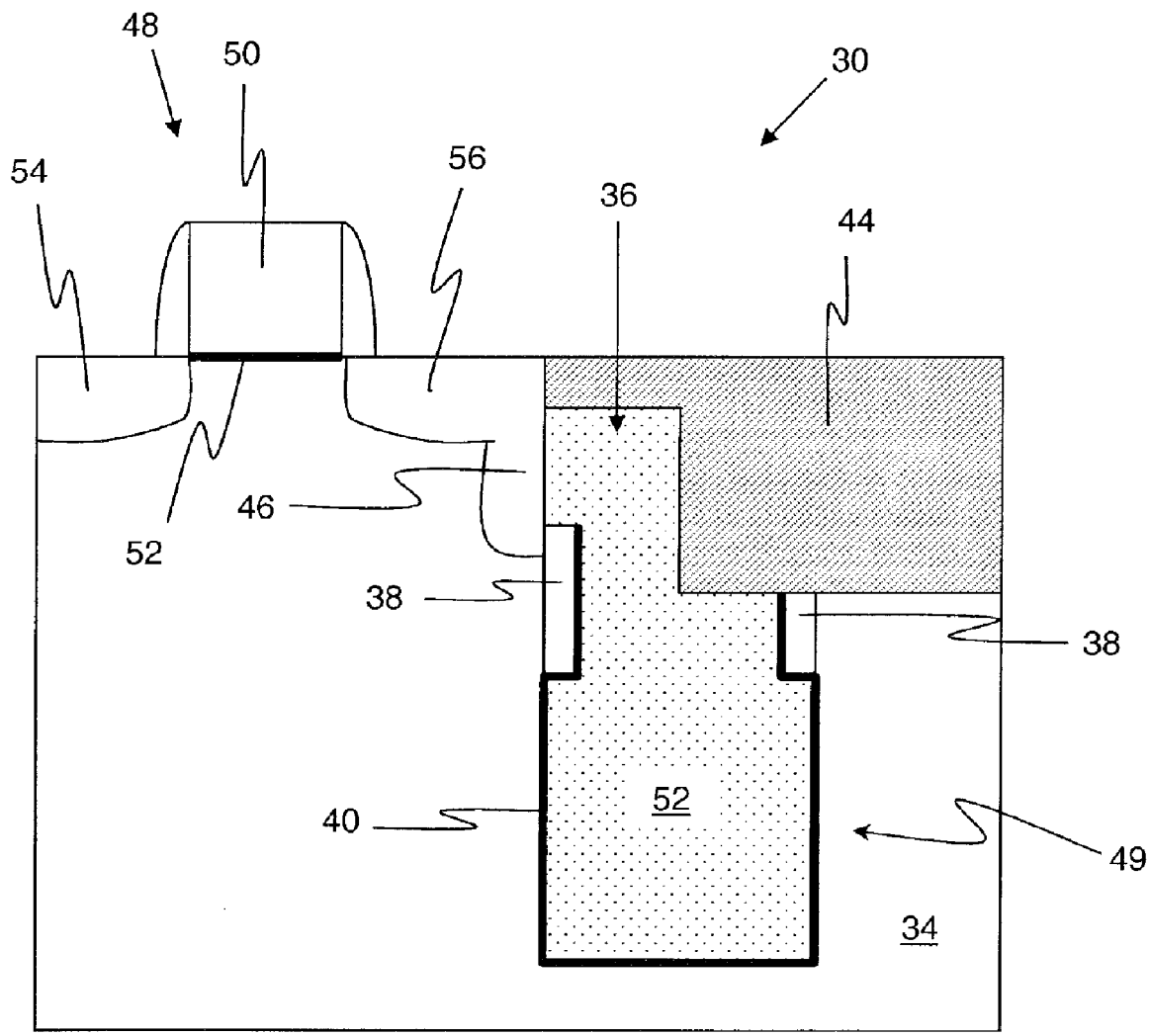
FIG. 3 depicts a cross-sectional elevation view of a first embodiment of a completed trench memory with monolithic conducting material, in accordance with the present invention.

FIG. 2B follows wherein a node dielectric material 40 is formed, or deposited, on sidewall of trench 36. Node dielectric material 40 may be silicon nitride ($Si_3N_4$), silicon dioxide ($SiO_2$), or other suitable dielectric material formed by thermal growth, sputtering, deposition, or other suitable techniques. Subsequently, a filling material 42 is placed within trench 36 so as to abut node dielectric material 40. Filling material 42 may be spin on glass (SOG), resist, or other suitable material. Filling material 42 is recessed, or removed, partially from trench 36 to a point along insulating collar 38 by any conventional recess process such as reactive ion etch (RIE), chemical downstream etch (CDE), or other suitable etch techniques now known or later developed.

Figure 2C:
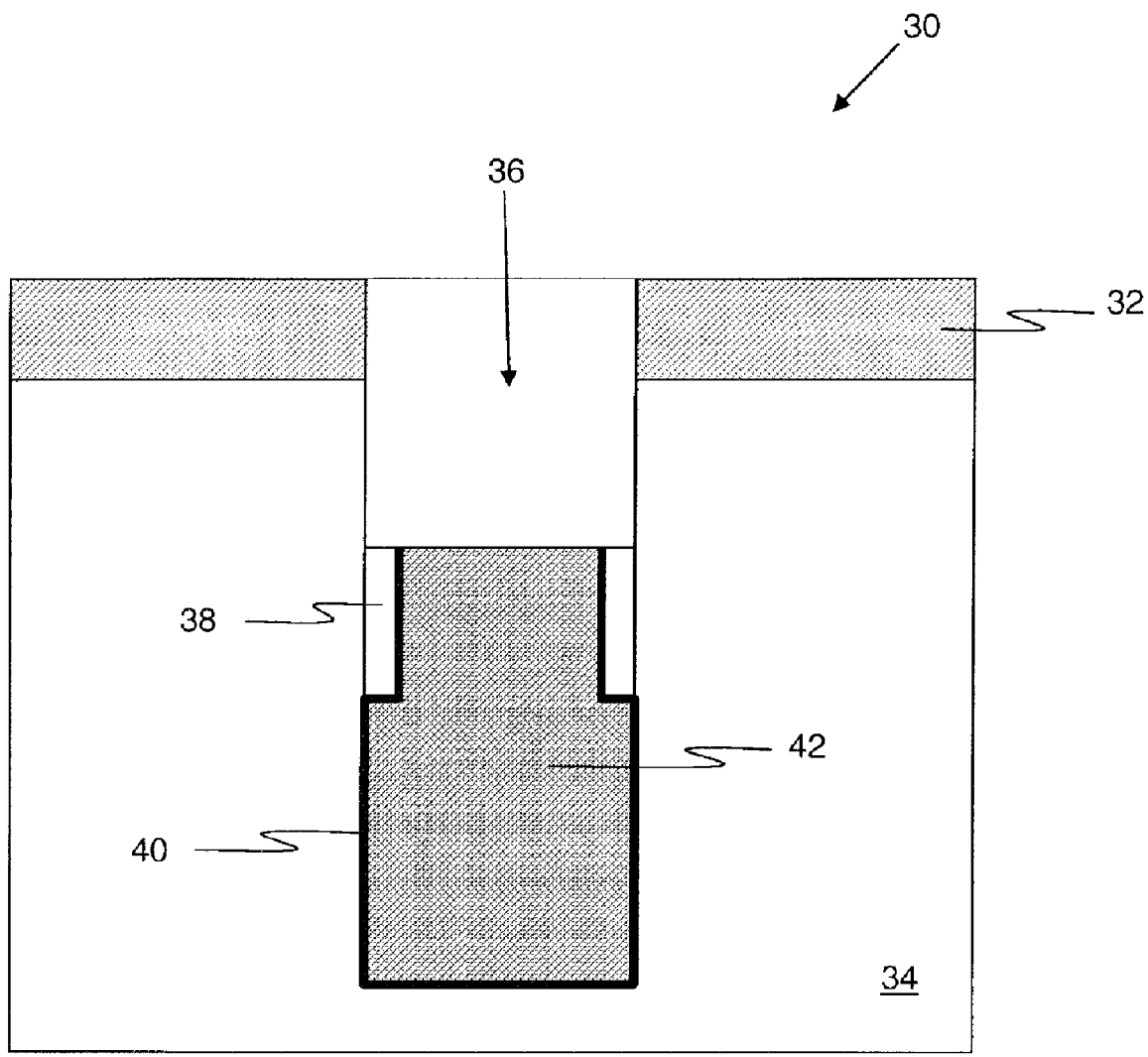

In FIG. 2C portions of node dielectric material 40 and insulating collar 38 (i.e., portion above filling material 42) are removed from trench 36. Thus, insulating collar 38, dielectric material 40, and filling material 42 that remain within trench 36 are substantially at the same height in trench 36.

Figure 2D:
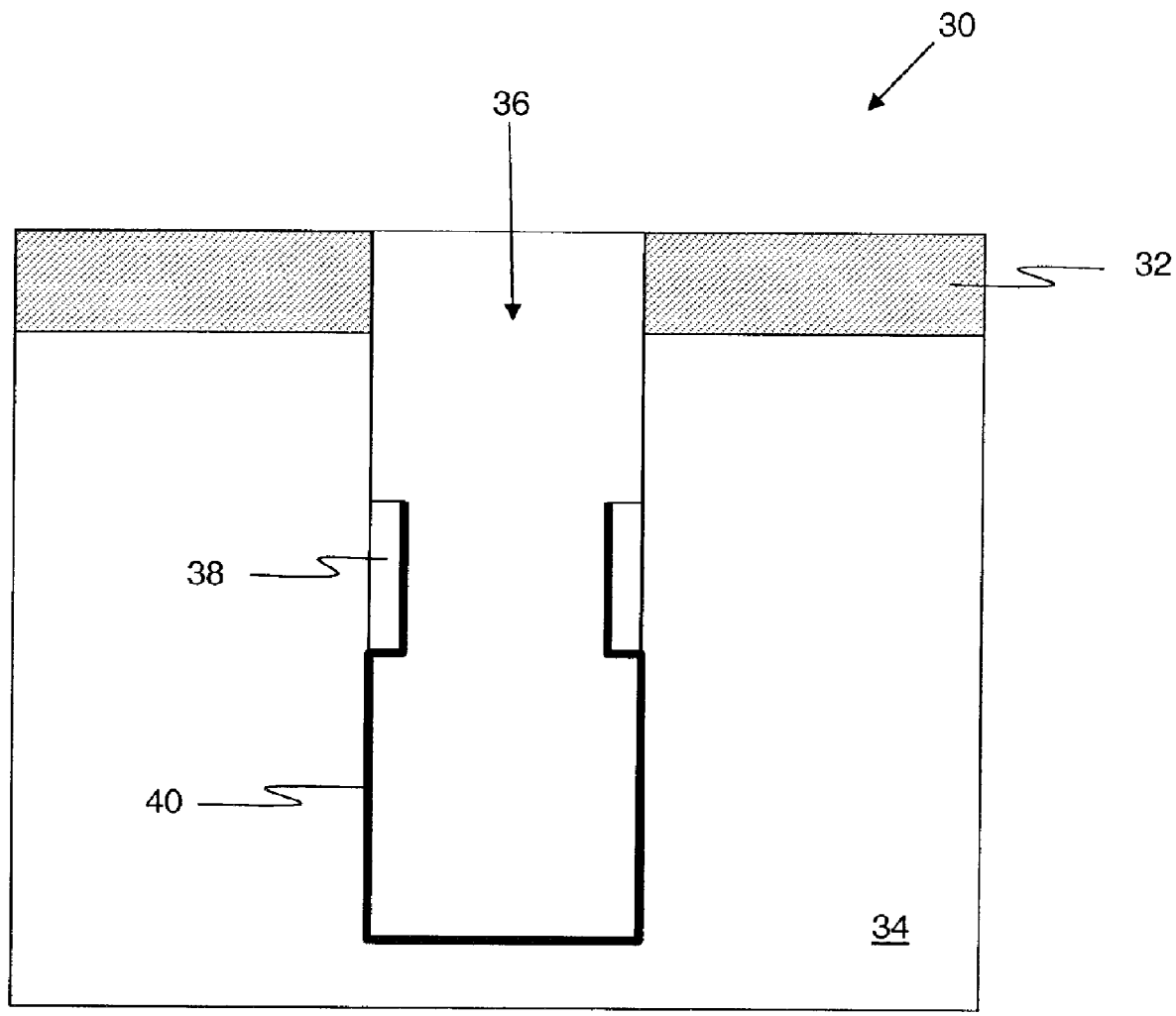

Subsequently, filling material 42 (FIG. 2C) is removed in its entirety from trench 36, such that insulating collar 38 and dielectric material 40 remains in trench 36 as shown in FIG. 2D. Removal techniques may include RIE, CDE, wet etch and other suitable removal techniques now known or later developed.

Figure 2E:
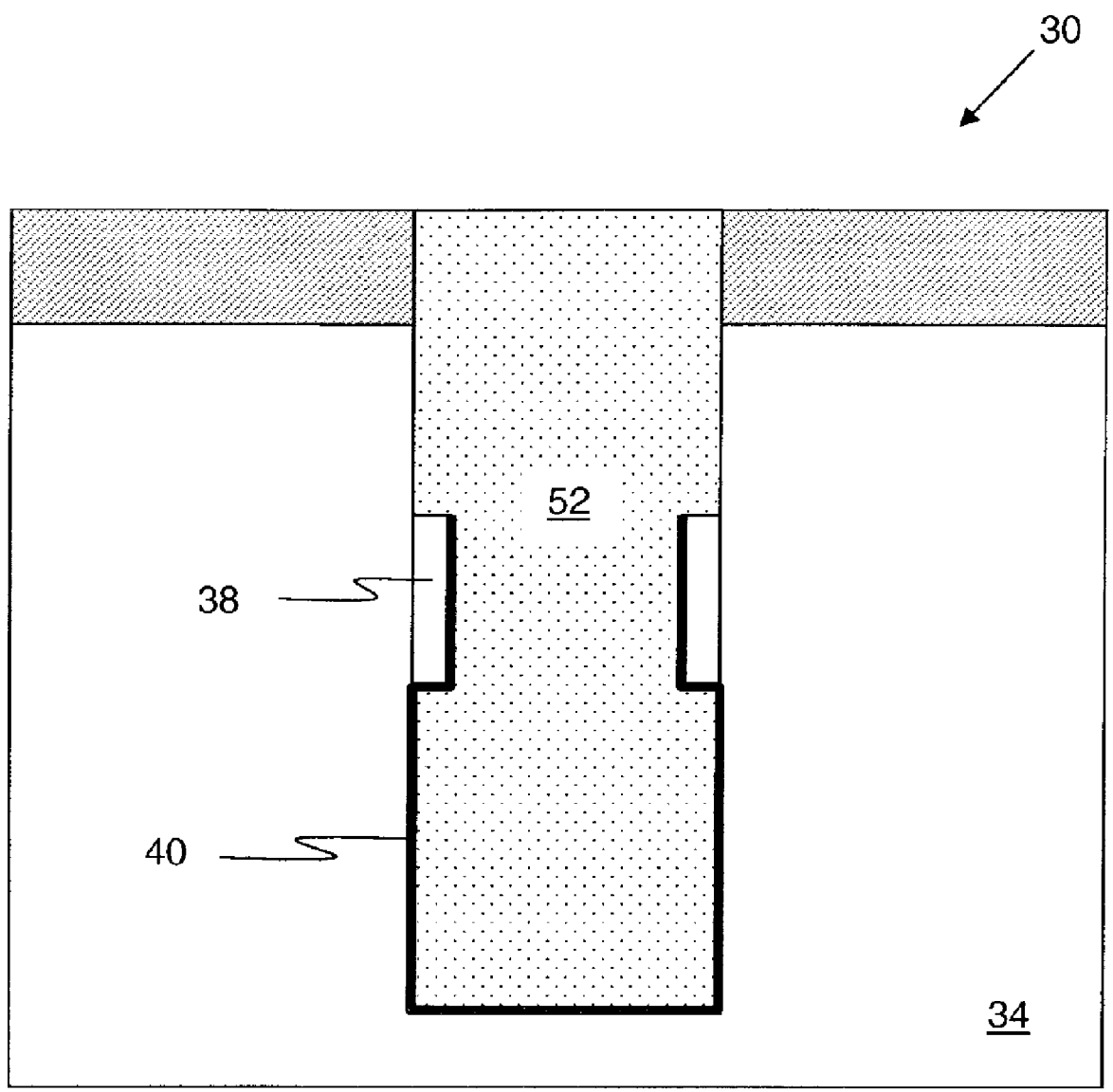

FIG. 2E follows wherein a conducting material 52 is placed in trench 36. Placement techniques may include chemical vapor deposition (CVD), atomic layer deposition (ALD), physical vapor deposition (PVD), sputtering, plating, and other suitable techniques now known or later developed. Conducting material 52 may be placed so as to substantially, or completely, fill trench 36. In an embodiment where trench 36 is filled less than its entire depth (i.e., substantial filling), conducting material 52 is placed in trench 36 to an amount so as to abut, or adjoin, adjacent buried strap 46 (FIG. 3), so as to create connectivity between conducting material 52 and buried strap 46. In an embodiment where trench 36 is completely filled with conducting material 52, in a subsequent step, an upper portion of conducting material 52 may be removed so as to make room for subsequent placement of shallow trench isolation (STI) 44 (FIG. 3) above remaining conducting material 52. Conducting material 52 may be doped polysilicon, although other suitable conducting material such as a doped silicon germanium, a metal (e.g., tungsten, titanium, etc.) or an alloy (e.g., tungsten silicide, titanium nitride, etc.). Placement may be done in a monolithic fashion so that single conducting material 52 is a single piece; so that there exists no interfaces in conducting material 52. Further, conducting material 52 may be placed in one temporal step, rather than three steps (or, in multiple steps), thereby reducing process time and cost.

FIG. 3 depicts a first embodiment of a finished trench memory 30 (e.g., DRAM) wherein an upper portion of single conducting material 52 has been partially recessed and thereupon STI 44 has been formed. As a result, completed trench memory 30 includes a buried strap 46 that is contiguous with monolithic conducting material 52. Further, trench memory 30 has a lower, and thereby improved, resistance because there are no interfaces within conducting material 52. Completed trench memory (e.g., DRAM) 30 includes one capacitor 49 and one transistor (e.g., conventional MOSFET) 48 connected via a buried strap 46 to each other. Transistor 48 includes a gate conductor 50, gate dielectric 52, and a drain 54 and a source 56 on either side of gate conductor 50.

Figure 4A:
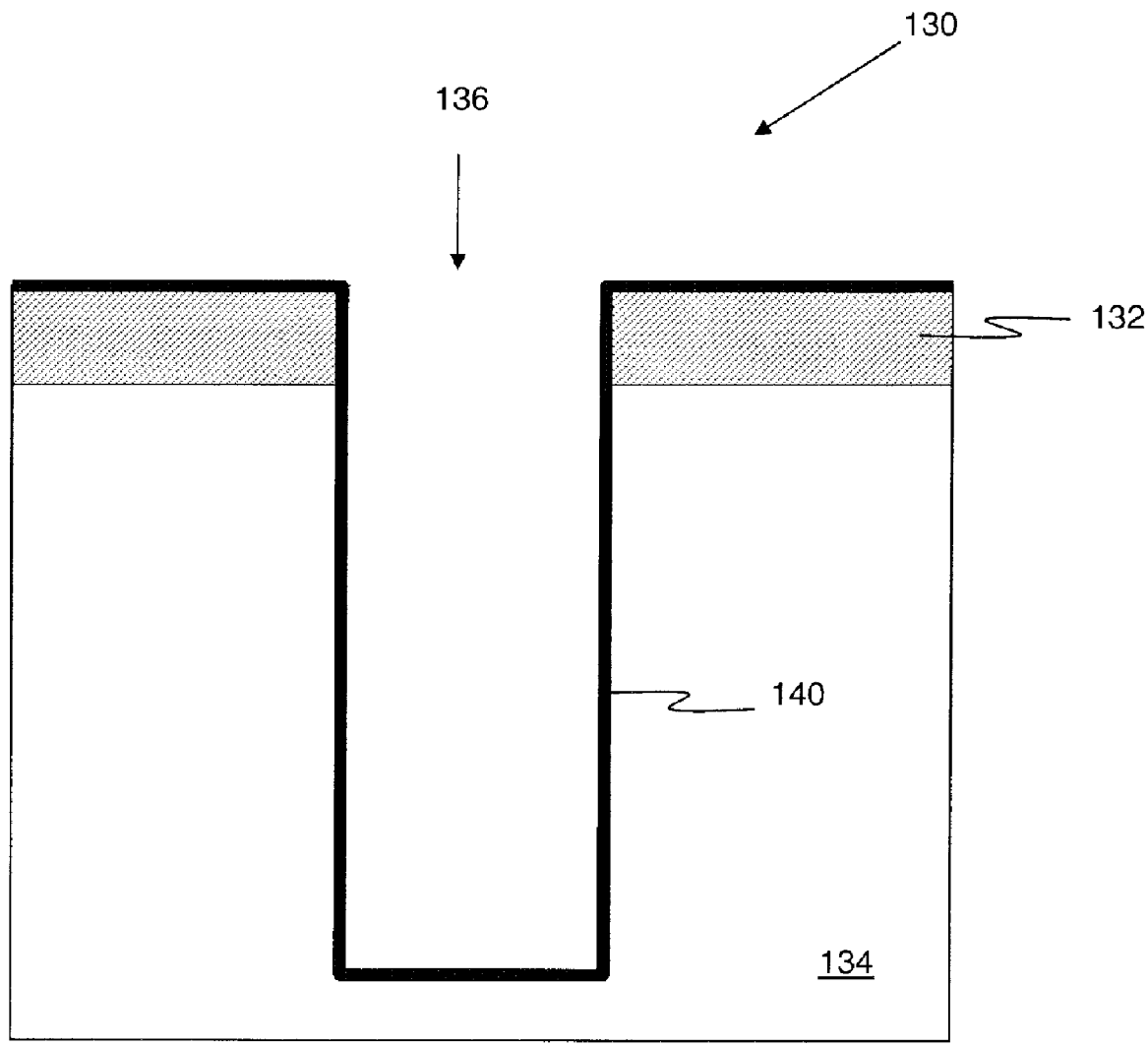
FIGS. 4A-4G depict cross-section elevation views of steps of forming a trench memory with monolithic conducting material, in accordance with a second embodiment of the present invention.
Figure 4B:
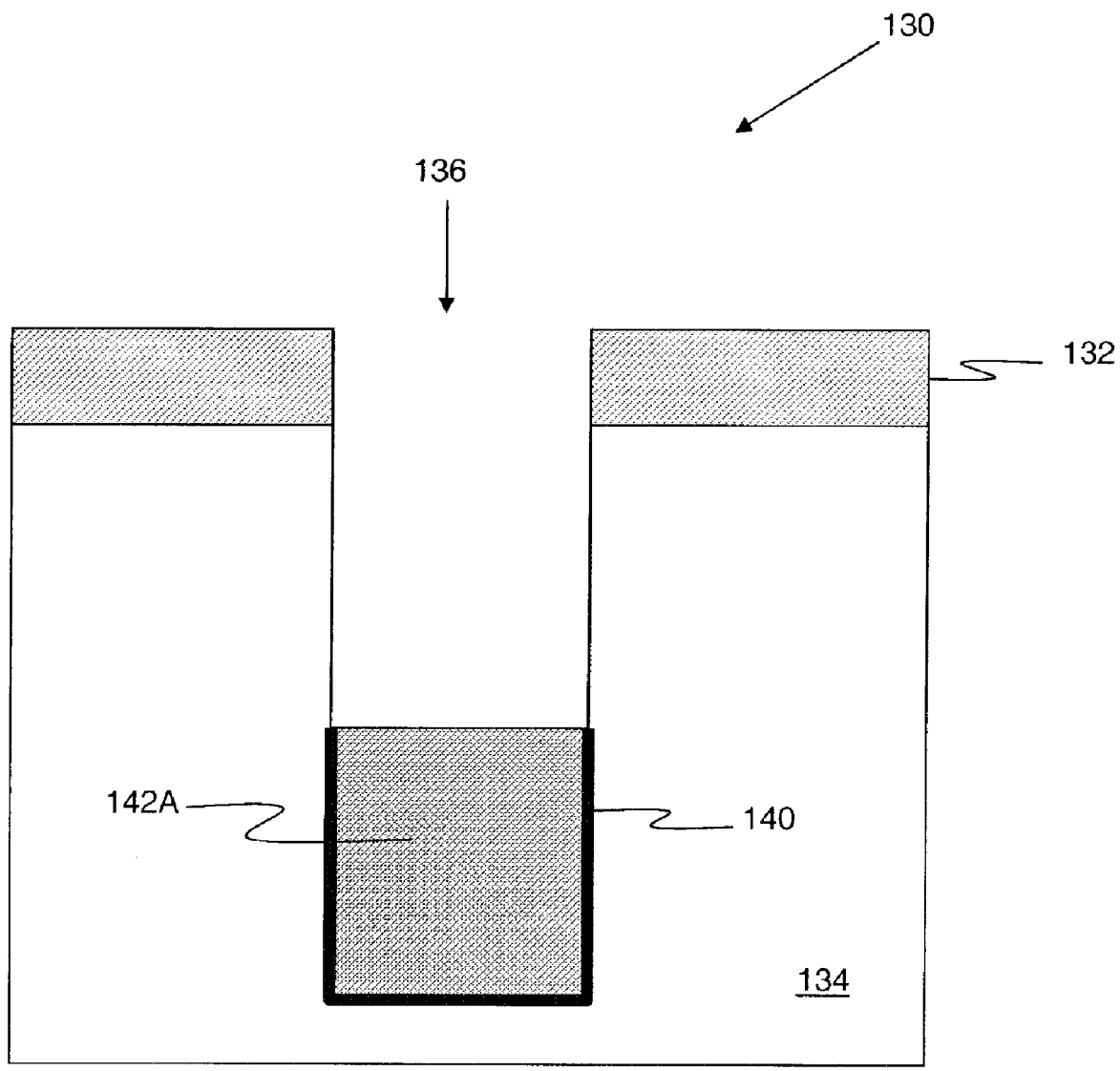
Figure 5:
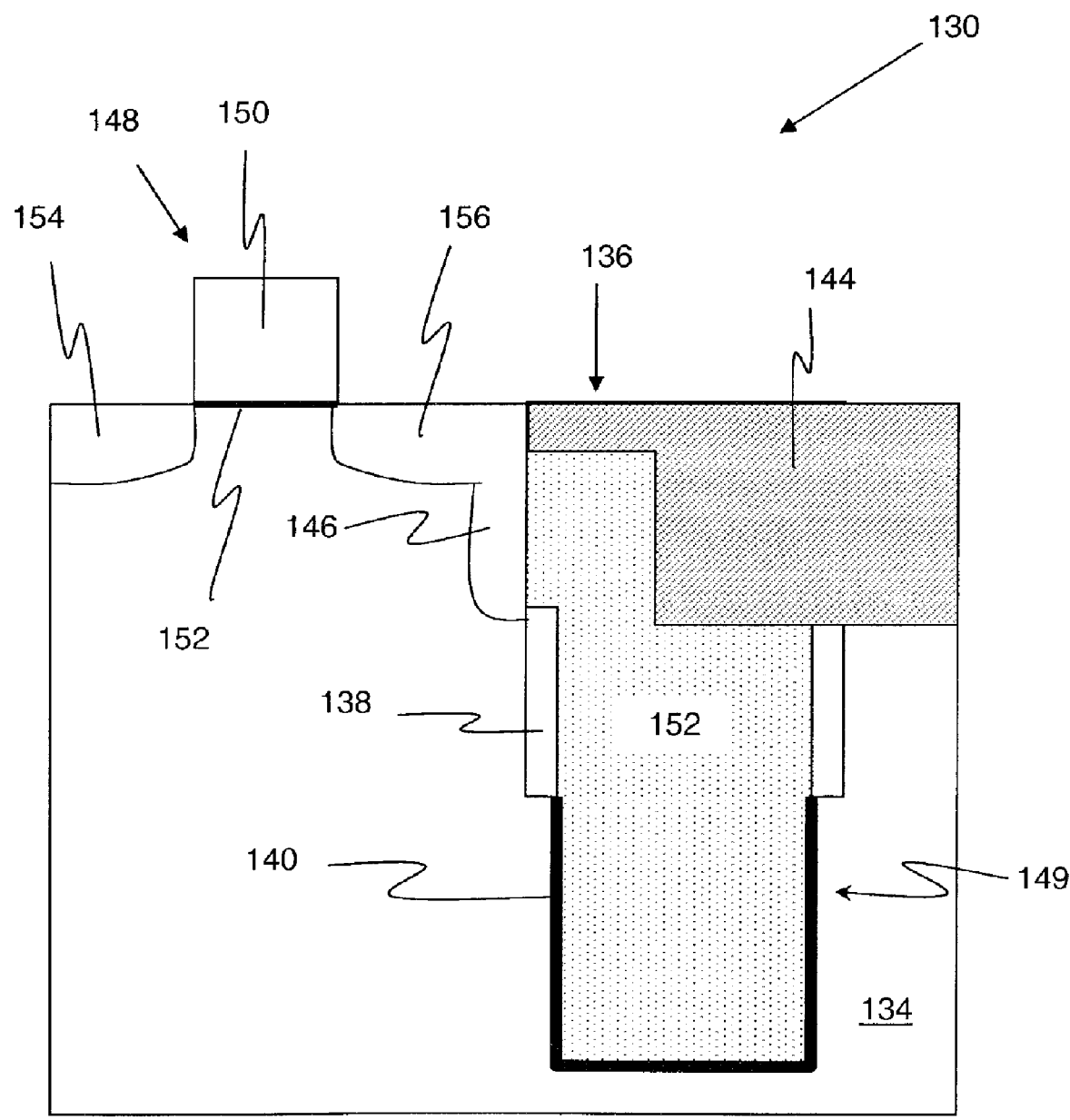
FIG. 5 depicts a cross-sectional elevation view of a second embodiment of a completed trench memory with monolithic conducting material, in accordance with the present invention.

FIG. 4A shows the starting of a process to form trench memory 130 in accordance with a second embodiment of the present invention wherein trench memory 130 has a pad layer 132 (e.g., silicon nitride) above a semiconductor (e.g., silicon) substrate 134. Between pad layer 132 and semiconductor substrate 134 may be an underlying silicon oxide ($SiO_2$) layer (not shown). Formed into semiconductor substrate 134 is a trench 136. Further formed, or deposited, in trench 136 is a node dielectric material 140 on a sidewall of trench 136. Node dielectric material 140 may be silicon nitride, silicon dioxide, or other suitable dielectric material formed by thermal growth, sputtering, deposition, or other suitable techniques now known or later developed.

In a second step (FIG. 4B), a first filling, or sacrificial, material 142A is placed within trench 136 so as to abut node dielectric material 140. First filling material 142A may be spin on glass (SOG), resist, or other suitable polymer material. First filling material 142A and node dielectric material 140 are recessed, or removed, partially from trench 136 so that first filling material 142A and node dielectric material 140 are substantially at the same height.

Figure 4C:
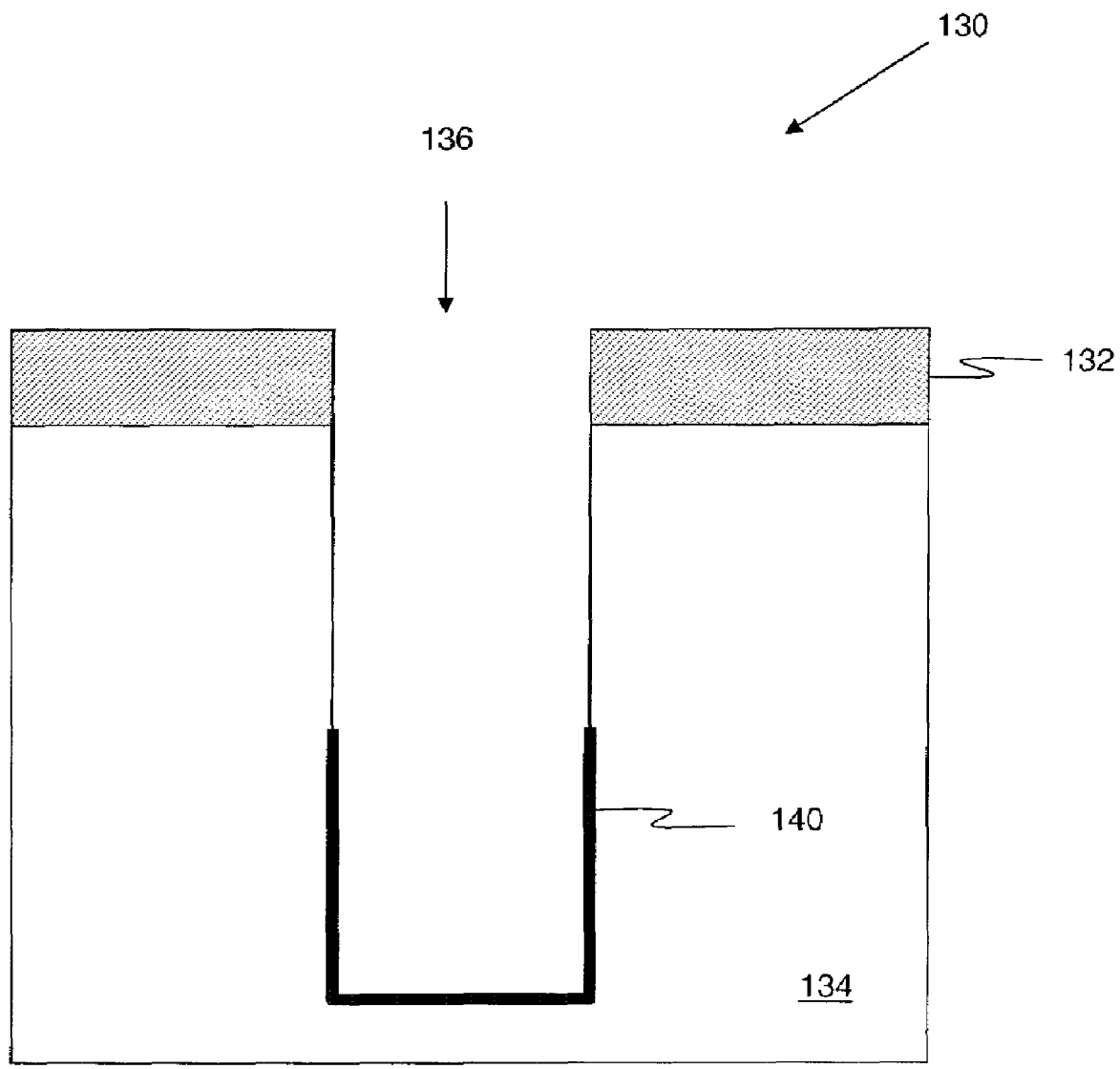
Figure 4D:
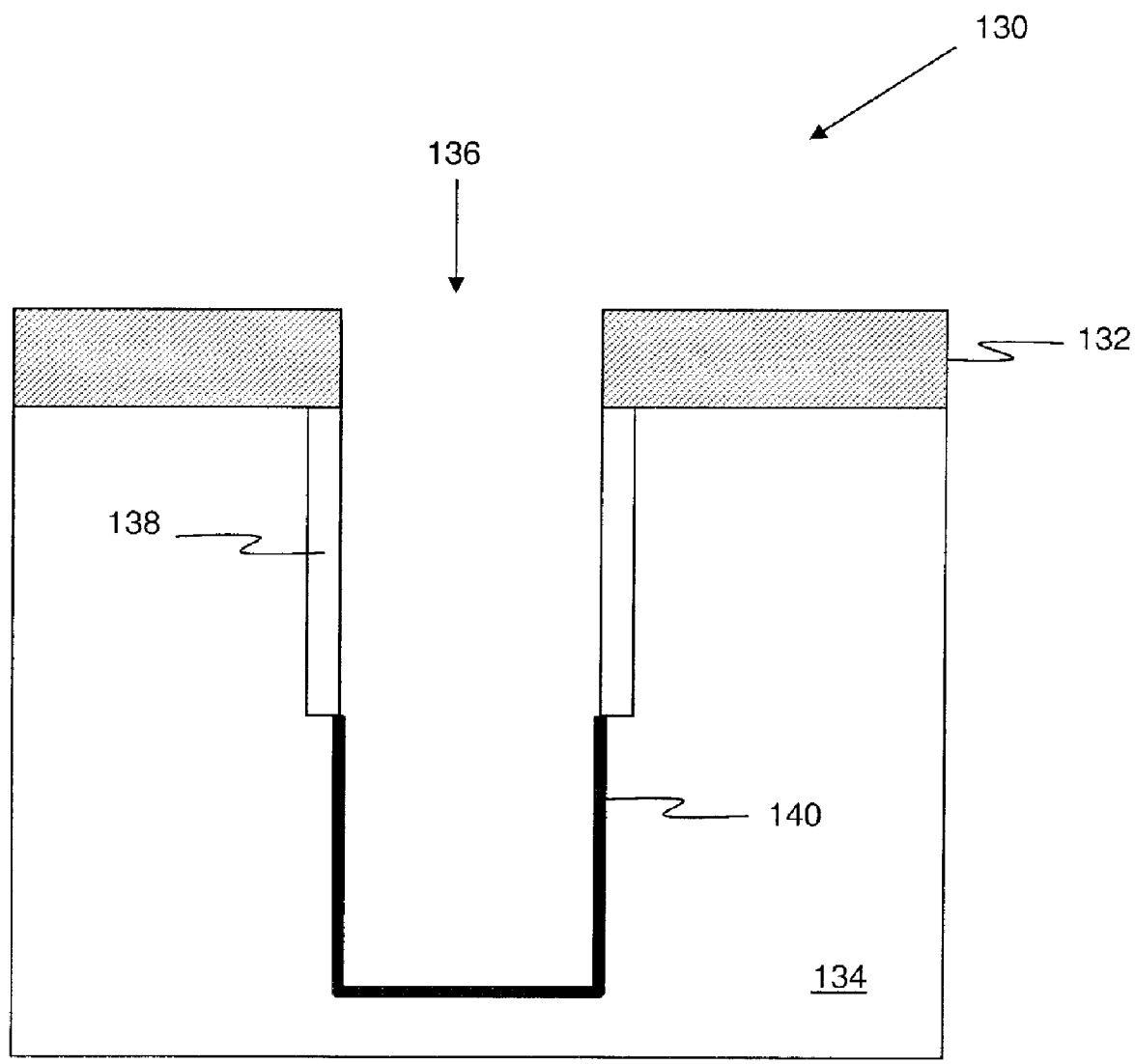

Then, as shown in FIG. 4C, first filling material 142A is removed in its entirety from trench 136, such that node dielectric material 140 remains in lower portion of trench 136.

Upon removal of first filling material 142A from trench 136, an insulating collar 138 is formed in an upper portion of trench 136. Insulating collar 138 typically is made of silicon dioxide ($SiO_2$), silicon nitride ($Si_3N_4$), or any suitable dielectric material by methods including oxidizing an exposed sidewall of trench 136. In this manner, insulating collar 138 abuts node dielectric material 140 along side of trench 136.

Figure 4E:
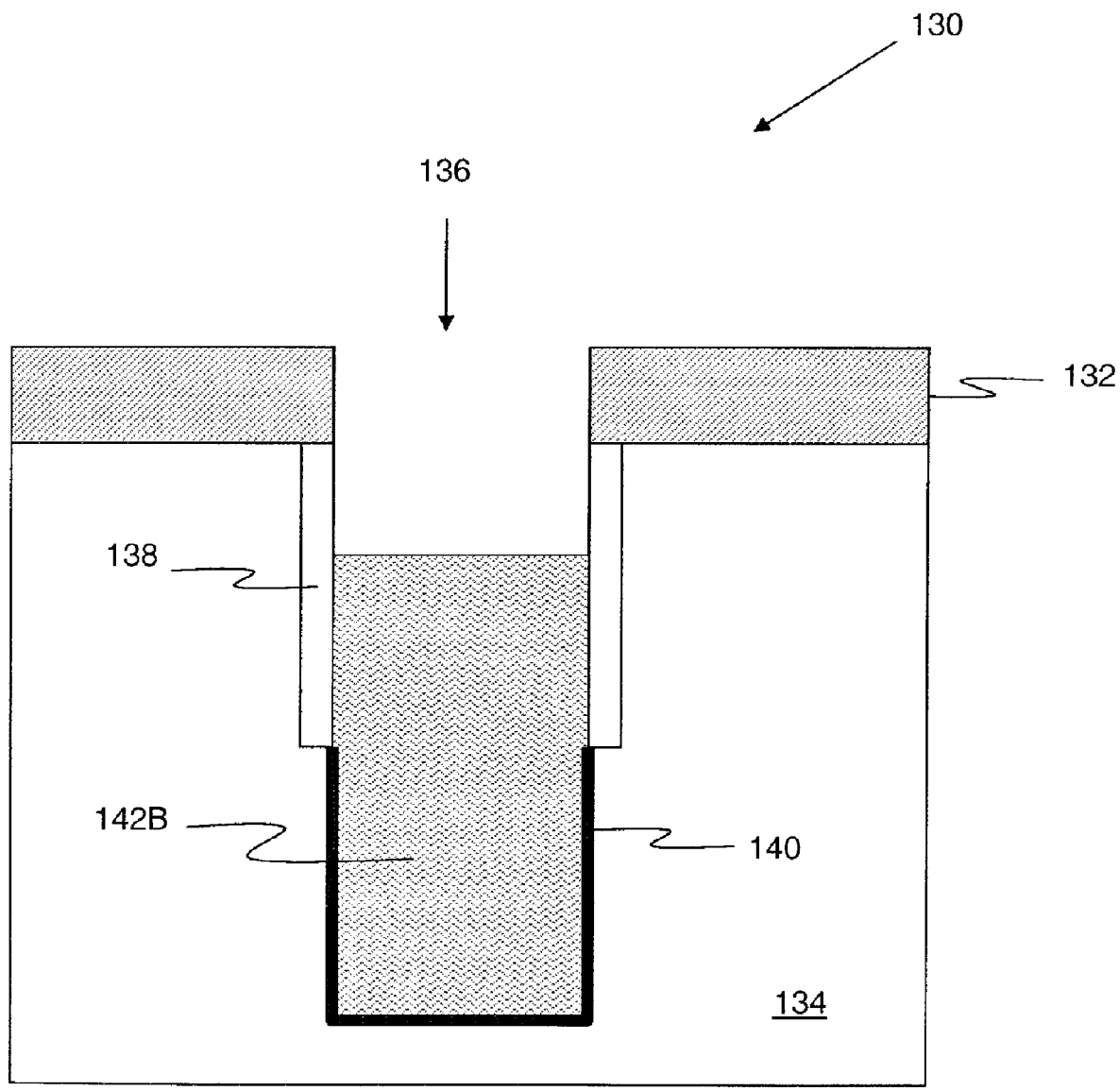

A second filling, or sacrificial, material 142B is placed within trench 136 so as to abut node dielectric material 140 and insulating collar 138. Similarly, second filling material 142B may be spin on glass (SOG), resist, or other suitable polymer material. Second filling material 142B is recessed, or removed, partially from trench 136 so as to expose a portion of insulating collar 138, as shown in FIG. 4E.

Figure 4F:
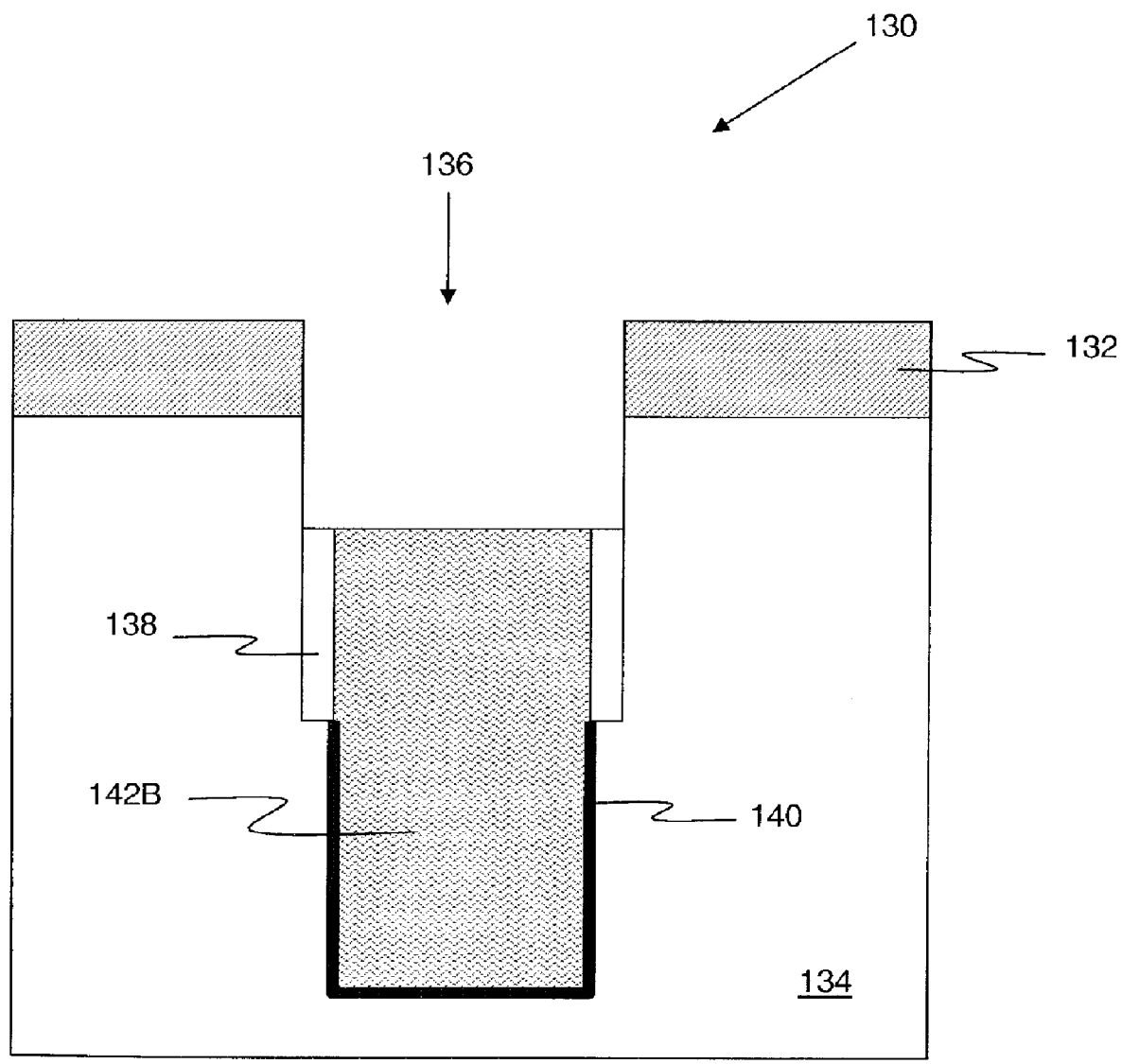

An exposed portion of insulating collar 138 (i.e., portion above second filling material 142B) is removed from trench 136 (FIG. 4F). In one embodiment, insulating collar 138 and second filling material 42B that remain are aligned so as to be substantially at the same height.

Figure 4G:
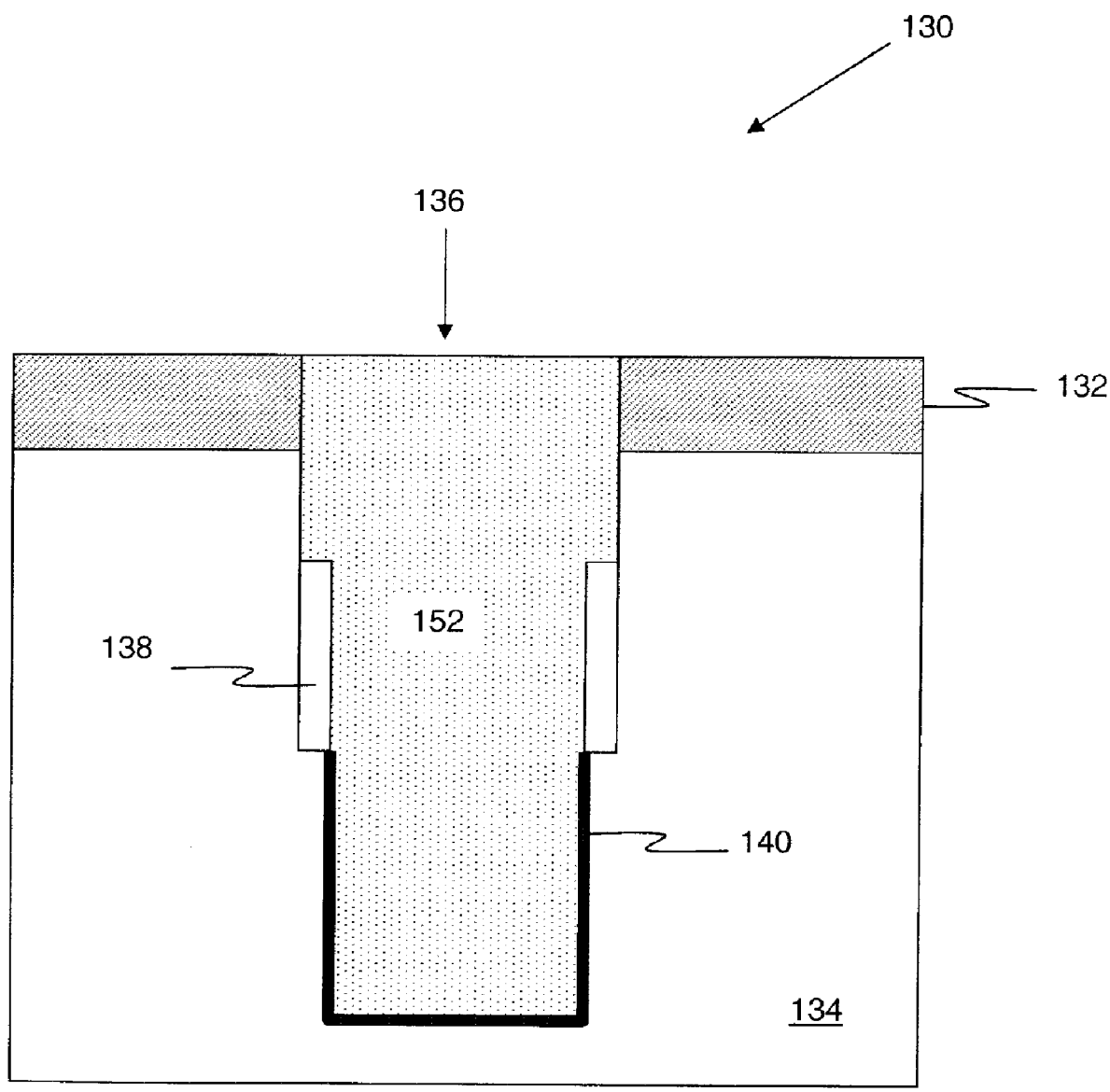

In a penultimate step, as shown in FIG. 4G, second filling material 142B is removed from trench 136 and a conducting material 152 is placed in trench 136. Conducting material 152 may be placed so as to substantially, or completely, fill trench 136. In an embodiment, where trench 136 is substantially filled, conducting material 152 is placed so that buried strap 146 (FIG. 5) is contiguous to conducting material 152. Contrastingly, when conducting material 152 is be placed in trench 136 to completely fill trench 136, in a subsequent step an upper portion of conducting material 152 is removed so as to make room for subsequent placement of STI 144 (FIG. 5)

above conducting material 152. Conducting material 142 may be doped polysilicon, although other suitable conducting material such as a doped silicon germanium, a metal (e.g., tungsten, titanium, etc.) or an alloy (e.g., tungsten silicide, titanium nitride, etc.) may be used. Placement may be done in a fashion so that single conducting material 152 is monolithic within trench 136, so that there exists no interfaces within conducting material 152. Further, conducting material 152 may be placed in one temporal step, rather than three steps (or, in multiple steps), thereby reducing process time and cost.

FIG. 5 depicts completed second embodiment of trench memory 130 (e.g., DRAM) wherein an upper portion of single conducting material 152 has been partially recessed and thereupon STI 144 has been formed. As a result completed trench memory 130 includes a buried strap 146 that is contiguous with conducting material 152. Further, the trench memory 130 has a lower resistance because there are interfaces within conducting material 152. Completed trench memory (e.g., DRAM) 130 includes one capacitor 149 and one transistor (e.g., conventional MOSFET) 148 connected via a buried strap 146 to each other. Transistor 148 includes a gate conductor 150, gate dielectric 152, and a drain 154 and a source 156 on either side of gate conductor 150.

The foregoing description of the preferred embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

What is claimed is:

1. A method of forming a trench memory, comprising the steps of:
    forming a trench with a collar in the trench;
    forming a node dielectric on a sidewall of the trench;
    filling the trench with a monolithic conducting material;
    prior to the filling step, removing a portion of the node dielectric, wherein all remain node dielectric is below the collar; and
    removing a portion of the collar.

2. The method of claim 1, wherein the filling step includes filling the trench with the monolithic conducting material to a top of the trench.

3. The method of claim 1, wherein the filling step includes filling the trench with the monolithic conducting material so as to adjoin a buried strap.

4. The method of claim 1, further comprising:
    forming a shallow trench isolation (STI) above the monolithic conducting material.

5. The method of claim 1, further comprising:
    forming a transistor connected to a capacitor within the trench.

6. The method of claim 1, wherein the filling step includes filling the trench with the conducting material only once.

7. The method of claim 1, wherein the conducting material is one selected from a group consisting of a doped polysilicon, a doped silicon germanium, a metal, and an alloy.

8. The method of claim 1, wherein prior to the filling step, further comprises:
    filling the trench with a filling material;
    recessing the filling material; and
    removing the filling material.

9. A method of forming a trench memory comprising:
    depositing a node dielectric on a sidewall of a trench;
    forming a collar in an upper portion of the trench after the depositing;
    forming a capacitor in a lower portion of the trench below the collar;
    connecting a transistor to the capacitor, through a buried strap, wherein the trench is filled with a monolithic conducting material; and
    prior to the filling step, removing a portion of the node dielectric, wherein all remaining node dielectric is below the collar.

10. The method of claim 9, wherein the collar is formed by oxidation.

11. The method of claim 9, wherein the monolithic conducting material is one selected from a group consisting of a doped polysilicon, a doped silicon germanium, a metal, and an alloy.

12. The method of claim 9, prior to the forming a collar step, further comprises:
    filling the trench with a first filling material;
    recessing the first filling material;
    removing a portion of the node dielectric; and
    removing the first filling material.

13. The method of claim 12, prior to the forming a capacitor step, further comprises:
    filling the trench with a second filling material;
    recessing the second filling material;
    removing a portion of the collar; and
    removing the second filling material.

14. The method of claim 9, wherein the monolithic conducting material is free of a conducting material to conducting material interface.

15. The method of claim 9, further comprising:
    forming a shallow trench isolation (STI) above the monolithic conducting material.

* * * * *